US008671382B2

(12) United States Patent
Su et al.

(10) Patent No.: US 8,671,382 B2
(45) Date of Patent: *Mar. 11, 2014

(54) METHOD OF GENERATING RC TECHNOLOGY FILE

(71) Applicant: Taiwan Semiconductor Manufacturing Company, Ltd., Hsin-Chu (TW)

(72) Inventors: Ke-Ying Su, Taipei (TW); Hsiao-Shu Chao, Baoshan Township (TW); Yi-Kan Cheng, Taipei (TW); Yung-Chin Hou, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/858,760

(22) Filed: Apr. 8, 2013

(65) Prior Publication Data

US 2013/0227514 A1    Aug. 29, 2013

Related U.S. Application Data

(63) Continuation of application No. 13/039,730, filed on Mar. 3, 2011, now Pat. No. 8,418,112.

(51) Int. Cl.
G06F 17/50 (2006.01)
G06F 11/22 (2006.01)

(52) U.S. Cl.
USPC ............ 716/136; 716/119; 716/126; 716/129

(58) Field of Classification Search
USPC .................. 716/119, 126, 129, 136
See application file for complete search history.

(56) References Cited

U.S. PATENT DOCUMENTS

| 6,279,142 | B1 | 8/2001 | Bowen et al. |
| 2008/0133201 | A1 | 6/2008 | Guedon |
| 2009/0077507 | A1 | 3/2009 | Hou et al. |
| 2012/0007688 | A1 | 1/2012 | Zhou et al. |

OTHER PUBLICATIONS

Wan, W.K., et al., "Using Equivalent Dielectric Constant to Simplify the Analysis of Patch Microstrip Antenna with Multi Layer Substrates," IEEE, Antennas and Propagation Society Symposium, vol. 2, 1998, pp. 676-679.

*Primary Examiner* — Stacy Whitmore
*Assistant Examiner* — Magid Dimyan
(74) *Attorney, Agent, or Firm* — Slater & Matsil, L.L.P.

(57) ABSTRACT

A method of generating resistance-capacitance (RC) technology files is disclosed. The method comprises receiving a plurality of metal schemes from an IC foundry and dividing the plurality of metal schemes into one or more modular RC groups. The method further comprises identifying a modular RC structure; calculating capacitance values of the modular RC structure by means of a field solver; calculating an equivalent dielectric constant and an equivalent height of the RC structure based upon a variety of interconnect layers not having interconnects; calculating an equivalent dielectric constant and an equivalent height for each of the plurality of metal schemes; and deriving capacitance values of each of the plurality of metal schemes from the capacitance values of the modular RC structure.

20 Claims, 8 Drawing Sheets

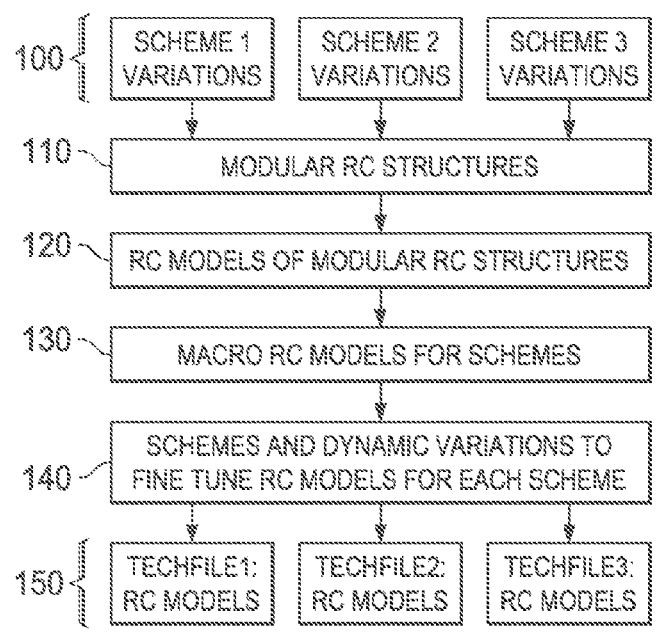
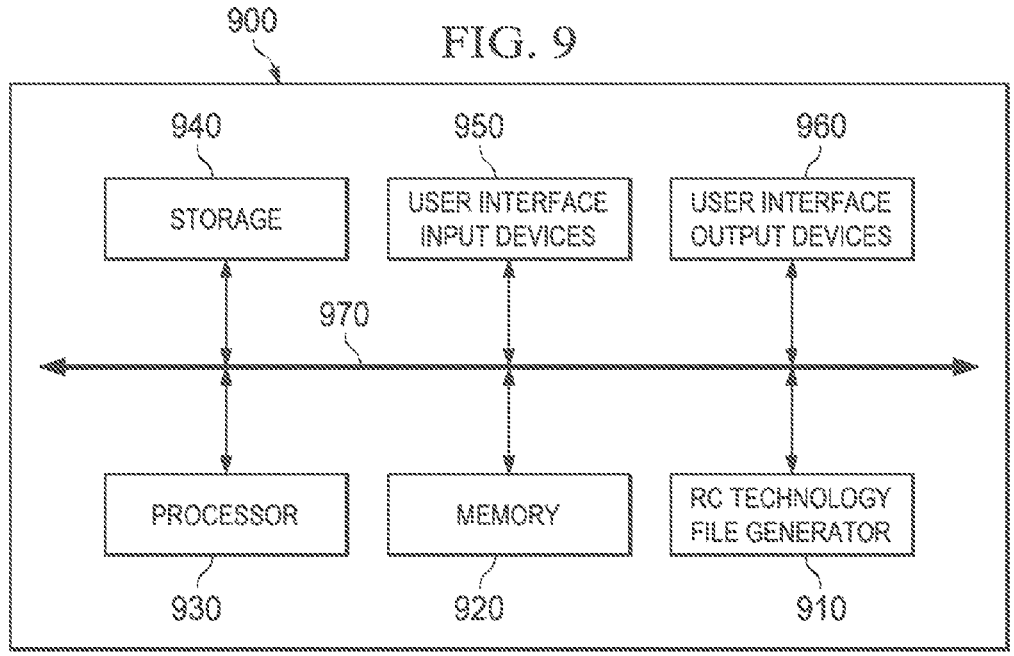

METHOD OF GENERATING RC TECHNOLOGY FILE

This application is a continuation of U.S. patent application Ser. No. 13/039,730, filed on Mar. 3, 2011, and entitled "Method of Generating RC Technology File," which application is hereby incorporated herein by reference in its entirety.

BACKGROUND

As semiconductor technologies evolve, integrated circuits (IC) have migrated to small feature sizes, such as 65 nanometers, 45 nanometers, 32 nanometers and below. Semiconductor technologies with small feature sizes lead to more interactions between semiconductor fabrication and design. For example, the impact of parasitic effects will become more important for devices with small feature sizes. A variety of simulation and optimization procedures may be performed by IC designers to ensure the devices with small feature sizes meet the performance index to which they are specified.

One parasitic effect is parasitic elements derived from electrical characteristics of interconnected conductors of an IC. As known in the art, in a front-end-of-line (FEOL) process, an active layer is formed in a substrate. Once the active layer has been created, in a back-end-of-line (BEOL) process, a plurality of interconnect layers are formed on top of the active layer. In each interconnect layer, a metal layer is deposited first, then patterned so that various metal conductors are created. The metal conductors in different layers are interconnected by vias. As metal conductors are located in close proximity to each other, parasitic capacitances are formed between any two of them. In addition, a parasitic capacitance is also formed between a metal interconnect and ground.

In order to design high performance integrated circuits, the parasitic capacitance, inductance and resistance of interconnect conductors may be modeled so that some critical issues such as timing, noise and reliability can be accurately assessed. Various Electronic Design Automation (EDA) tools may be used to extract parasitic capacitance and resistance. For example, an EDA tool such as RAPHAEL from SYNOPSYS may first receive a SPICE model file from an IC foundry. Then, the EDA tool calculates the parasitic capacitance values related to each interconnect conductor by means of a field solver. The outcome of the field solver is saved as a resistance-capacitance (RC) technology file.

The generation of RC technology files is timing consuming. In addition, for an IC foundry, different clients may have slightly different interconnect structures. However, an IC foundry is required to dedicate one RC technology file for each interconnect structure despite that the difference between a variety of interconnect structures are minimal. In consideration of the large number of clients an IC foundry may have, the generation of RC technology files in a limited period of time is a challengeable job.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a flowchart including a sequence of steps for generating resistance-capacitance (RC) technology files;

FIG. 9 illustrates a simplified block diagram of an embodiment computer system that can be used to implement the method of generating RC technology files in accordance with an embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 2:
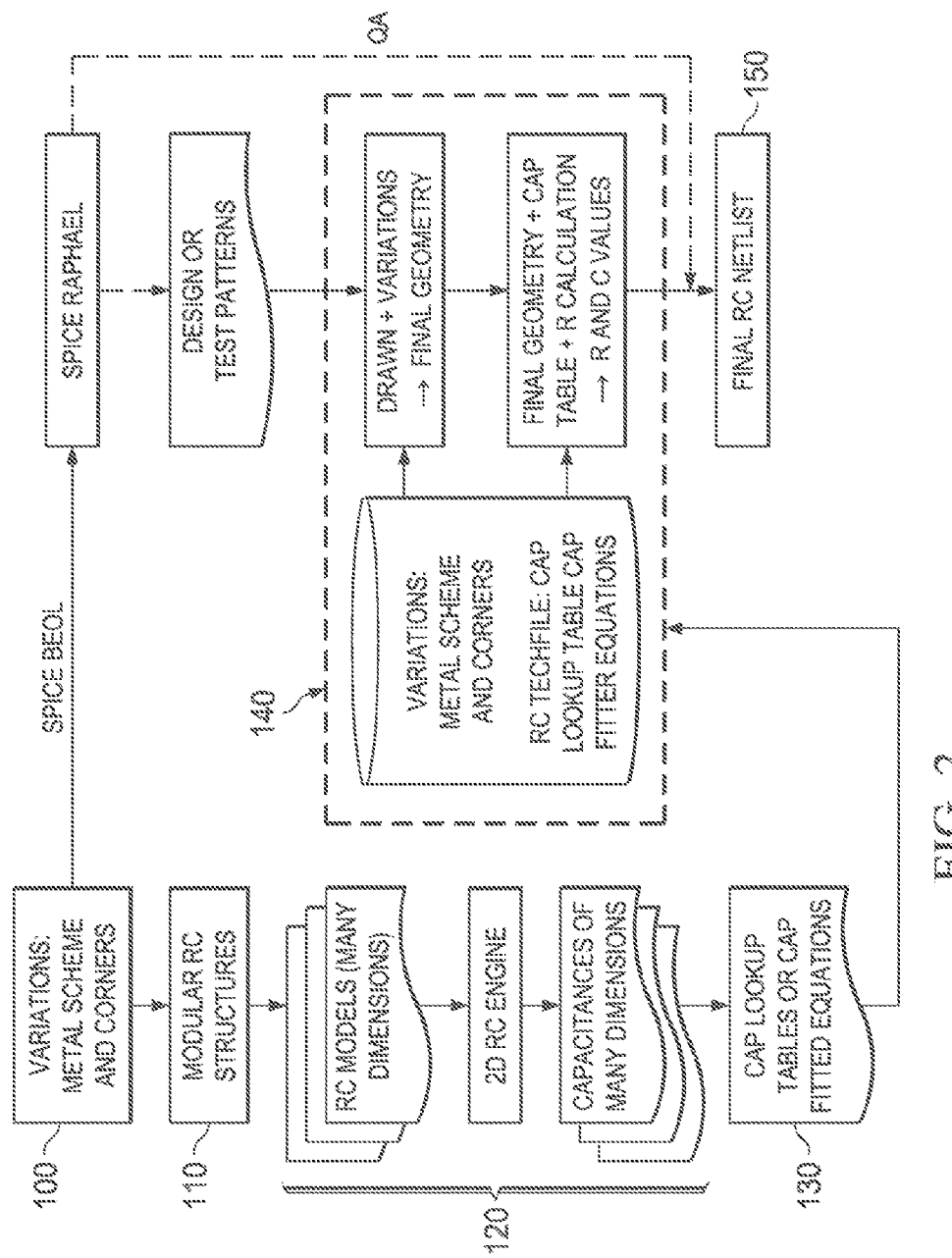
FIG. 2 depicts in a more detailed flowchart a sequence of steps for generating RC technology files.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, methods of generating a variety of resistance-capacitance (RC) technology files based on a macro RC model. The invention may also be applied, however, to generating RC technology files based upon a variety of macro RC models.

FIG. 1 illustrates a flowchart including a sequence of steps for generating RC technology files. In step 100, a plurality of schematic variation profiles are provided by an integrated circuit (IC) foundry. It should be noted that while FIG. 1 illustrates three schematic variation profiles, the number of schematic variation profiles illustrated herein is limited solely for the purpose of clearly illustrating the inventive aspects of the various embodiments. The present invention is not limited to any specific number of schematic variation profiles. Each schematic variation profile may include fabrication process parameters of the various interconnect layers in an IC, such as the numbers of interconnect layers, the spacing, width, resistivity and thickness of those interconnect layers as specified in the design rules, the dielectric constant, thickness, stacking of dielectric layers and the like.

In step 110, modular RC structures are generated based upon the plurality of schematic variation profiles. In accordance with an embodiment, the IC foundry inputs the schematic variation profiles wherein a variety of schematic variation profiles may have the same interconnect conductors. More particularly, the thickness, width and spacing of the interconnect conductors of those schematic variation files are same. The only difference is that each schematic variation profile may have a different number of dielectric layers. In addition, the thickness and dielectric constant of dielectric layers may be different too. Because the plurality of schematic variation profiles are similar except the differences described above, one or more schematic variation profiles may be selected to represent the plurality of schematic variation profiles. The selected schematic variation profiles are directed to an Electronic Design Automation (EDA) tool as modular RC structures.

In step 120, a field solver (not shown but illustrated in FIG. 2) of the EDA tool receives the modular RC structures. The field solver is a specialized software program capable of solving Maxwell's equations. Based upon the information from the modular RC structures, the field solver can identify a variety of primitives of conductive features and then calculate the parasitic capacitance of each primitive. The extracted capacitances from the primitives form a RC model.

In step 130, the RC model extracted from step 120 is defined as a macro RC model for the plurality of schematic variation profiles. In other words, a macro RC model is retrieved from a group of schematic variation profiles having similar interconnect conductors while the dielectric layers may have different characteristics. The macro RC model is re-usable and can be used as a base to generate a RC technology file for each schematic variation profile in the plurality of schematic variation files given by the IC foundry.

In step 140, based upon the macro RC model generated in step 130, a RC technology file for each metal scheme can be generated in consideration of the structural difference between each metal scheme and the metal scheme upon which the macro model is based. In other words, a group of metal schemes may share a similar interconnect distribution pattern (e.g., metal schemes 800, 810 and 820 shown in FIG. 8), but the dielectric layers of each metal scheme are slightly different from those of the metal scheme upon which the macro RC model is based. The dielectric layers between interconnect conductors of each metal scheme can be replaced by an equivalent dielectric layer. As a result, the RC technology file of a metal scheme can be derived from the macro RC model in consideration of the difference between the equivalent dielectric layer of the metal scheme and the equivalent dielectric layer of the macro RC model.

As it is known in the art, using an equivalent dielectric layer to replace a plurality of dielectric layers between two conductors does not have an impact on the parasitic capacitance between the two conductors. As a result, the group of metal schemes having a similar interconnect distribution pattern can be simplified to a group of metal schemes having the same location of interconnect conductors except different equivalent dielectric layers. As described in step 130, a metal scheme of this group may be selected as a modular RC structure. A macro RC model can be calculated based on the modular RC structure by means of a field solver. The RC technology files of other metal schemes of this group may be derived from the macro RC model based upon a simple mathematical equation rather than complicated Maxwell's equations. The simple mathematical equation will be described in detail with respect to FIG. 7.

In step 150, a plurality of RC technology files are generated. Each RC technology file may include a table wherein the capacitance between two interconnect conductors and the capacitance between an interconnect conductor and ground are presented. The validity of each RC technology file may be verified through a variety of product assurance processes such as semiconductor process characterization and failure analyses (not shown but illustrated in FIG. 2). Subsequently, the RC technology files shown in step 150 will be provided to various IC design customers. In order to describe the embodiments and the advantages more fully, FIG. 2 depicts in a more detailed flowchart a sequence of steps for generating RC technology files. The step 140 in FIG. 2 includes a process of replacing various dielectric layers with an equivalent dielectric layer in a modular RC structure comprising dielectric thickness variations. The step 140 will be described in detail with respect to FIG. 7.

Figure 3:
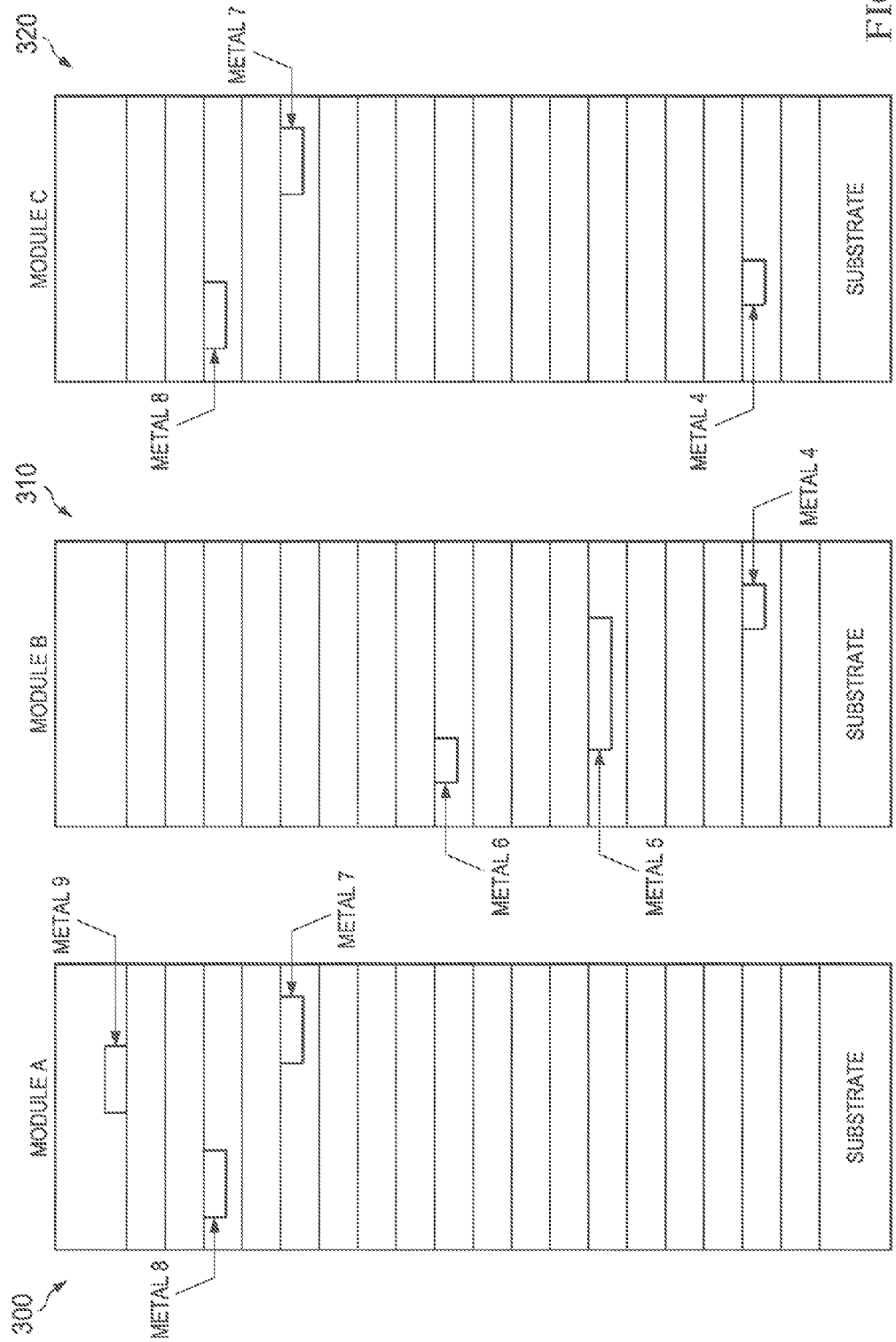
FIG. 3 illustrates three modular RC structures upon which three macro models are based.

FIG. 3 illustrates three modular RC structures upon which three macro RC models are based. A modular RC structure 300 includes a substrate, a conductive layer (not shown), a conductive polycrystalline (poly) layer (not shown), a variety of interconnect layers and dielectric materials formed between any two interconnect layers. As known in the art, interconnect conductors in some upper layers such as the seventh interconnect layer, the eighth interconnect layer and the ninth interconnect layer may be thicker than those in some lower layers such as the sixth interconnect layer and below. As illustrated in FIG. 3, the modular RC structure 300 represents a first group of metal schemes wherein each metal scheme may have the same interconnect conductors in the upper layers comprising thicker conductors. However, each metal scheme in this group may have different dielectric layers. More particularly, each metal scheme may have a different number of dielectric layers and each dielectric layer may have different process characteristics (e.g., thickness and dielectric constant value). Nevertheless, the dielectric layers in each metal scheme may be replaced by an equivalent dielectric layer. The process of replacing various dielectric layers with an equivalent dielectric layer will be described in detail with respect to FIG. 3.

Similarly, a modular RC structure 310 and a modular RC structure 320 include a substrate, a conductive layer (not shown), a conductive poly layer (not shown), a variety of interconnect layers and dielectric materials formed between any two interconnect layers. The interconnect conductors in the modular RC structure 310 are located in the lower layers. As described above, the interconnect conductors in lower layers are thinner than their counterparts in upper layers. The modular RC structure 320 provides another alternative metal scheme wherein the interconnect conductors comprise both thick metal conductors and thin metal conductors. In other words, the interconnect conductors in the modular RC structure 320 are located in both upper layers and lower layers.

Figure 4:
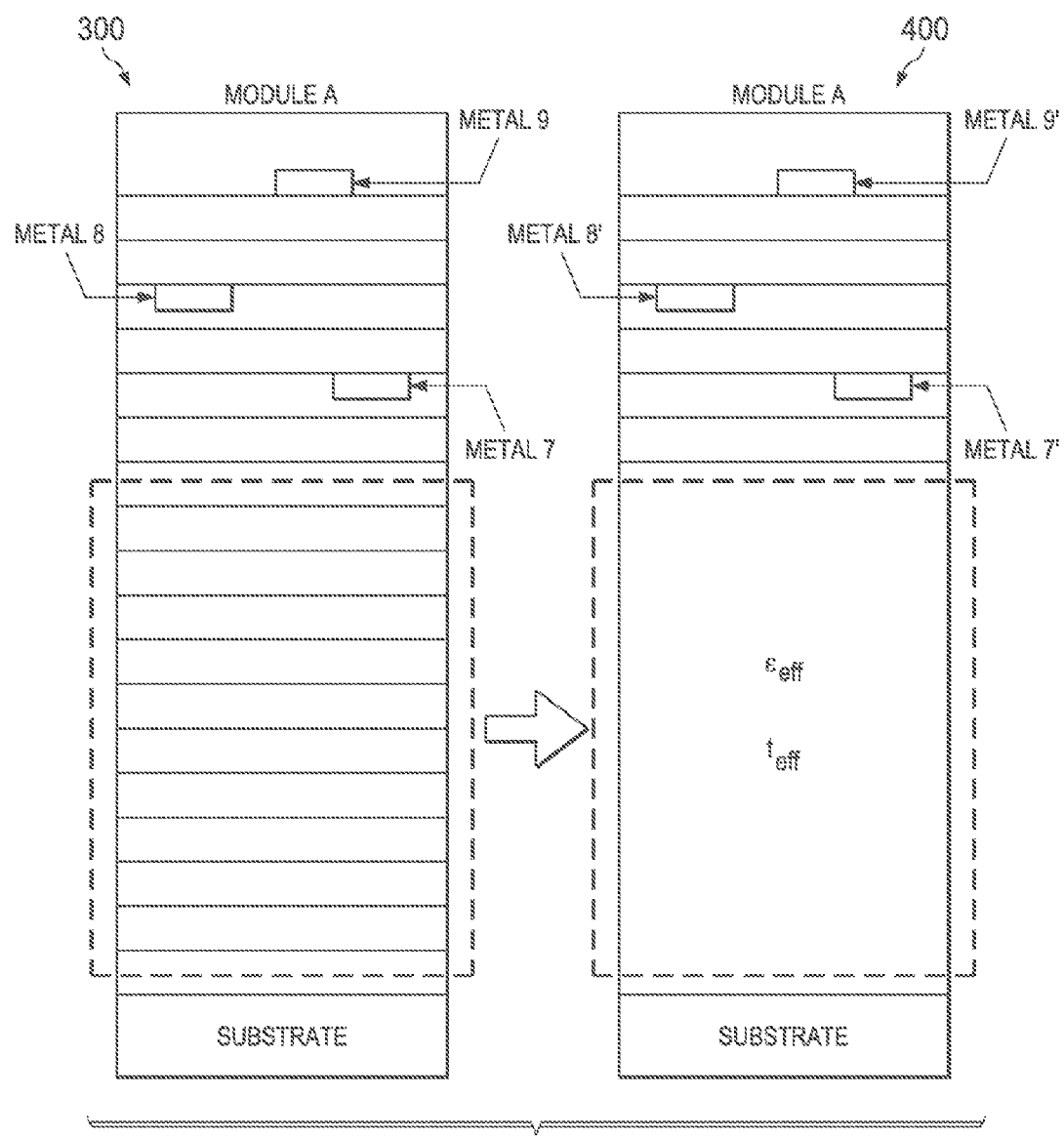
FIG. 4 illustrates a process of replacing various dielectric layers with an equivalent dielectric layer in a modular RC structure comprising thick interconnect conductors.

FIG. 4 illustrates a process of replacing various dielectric layers with an equivalent dielectric layer in a modular RC structure comprising thick interconnect conductors. In the modular RC structure 300, the interconnect conductors are located in the seventh interconnect layer, the eighth interconnect layer and the ninth interconnect layer. As shown in FIG. 4, the dielectric layers underneath the seventh interconnect layer do not comprise interconnect conductors. The electrical field between two interconnect conductors in the upper layers stores energy so that a capacitance is formed between two interconnect conductors. As known in the art, the magnitude of the electrical field decreases as the distance from a location to the source increases. As shown in FIG. 4, the dielectric layers underneath the seventh interconnect layer are located relatively far away from the interconnect layers, and therefore may have minimal impact on the capacitance between two interconnect conductors located in the upper layers. As a result, the dielectric layers can be simplified into a single equivalent dielectric layer as shown in a modular RC structure 400. As known in the art, each dielectric layer comprises two electrical characteristics, namely the thickness of a dielectric layer and the permittivity of a dielectric layer. The equivalent dielectric constant of N dielectric layers can be calculated as follows:

$$\varepsilon_{\mathit{eff}} = \left(\sum_{n=1}^{N} \frac{t_n}{\varepsilon_n}\right)^{-1} \cdot \left(\sum_{n=1}^{N} t_n\right)$$

where $t_n$ is the thickness of the nth dielectric layer and $\in_n$ is the permittivity of the nth dielectric layer. The equivalent thickness can be calculated as follows:

$$t_{\mathit{eff}} = \left(\sum_{n=1}^{N} t_n\right)$$

One advantageous feature of the equivalent dielectric layer is that the difference between two metal schemes having a similar interconnect distribution pattern, but different dielectric layers may be simplified into the difference between two equivalent dielectric layers. More particularly, a variety of electrical characteristics from various dielectric layers can be replaced with two equivalent characteristics as shown above.

Figure 5:
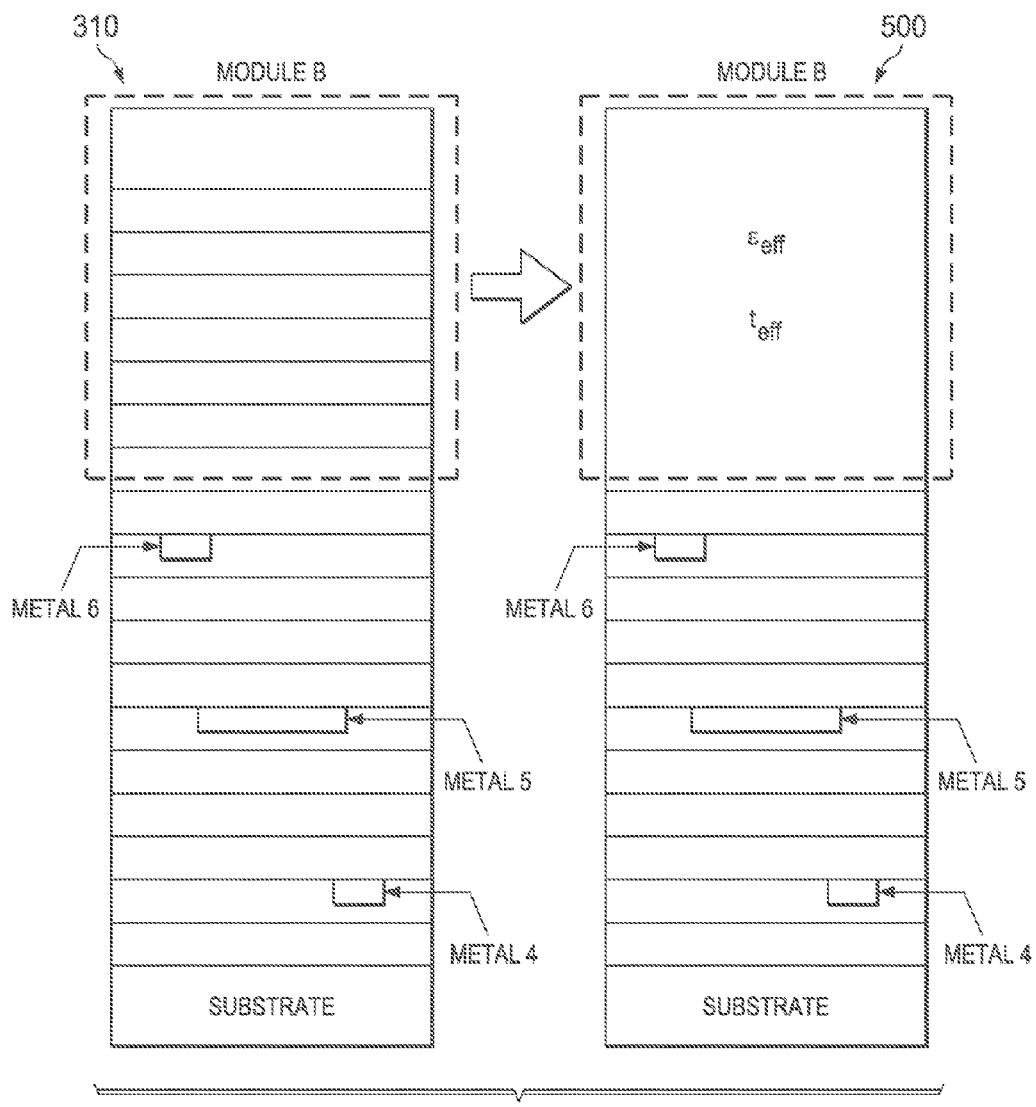
FIG. 5 illustrates a process of replacing various dielectric layers with an equivalent dielectric layer in an modular RC structure comprising thin interconnect conductors.

FIG. 5 illustrates a process of replacing various dielectric layers with an equivalent dielectric layer in a modular RC structure comprising thin interconnect conductors. As shown in FIG. 5, the interconnect conductors are located in the fourth interconnect layer, the fifth interconnect layer and the sixth interconnect layer. The dielectric layers above the sixth interconnect layer do not comprise interconnect conductors. Therefore, the dielectric layers can be simplified into a single equivalent dielectric layer as shown in a modular RC structure 500. The equations for the equivalent thickness and the equivalent dielectric constant are the same as those described above with respect to FIG. 4.

Figure 6:
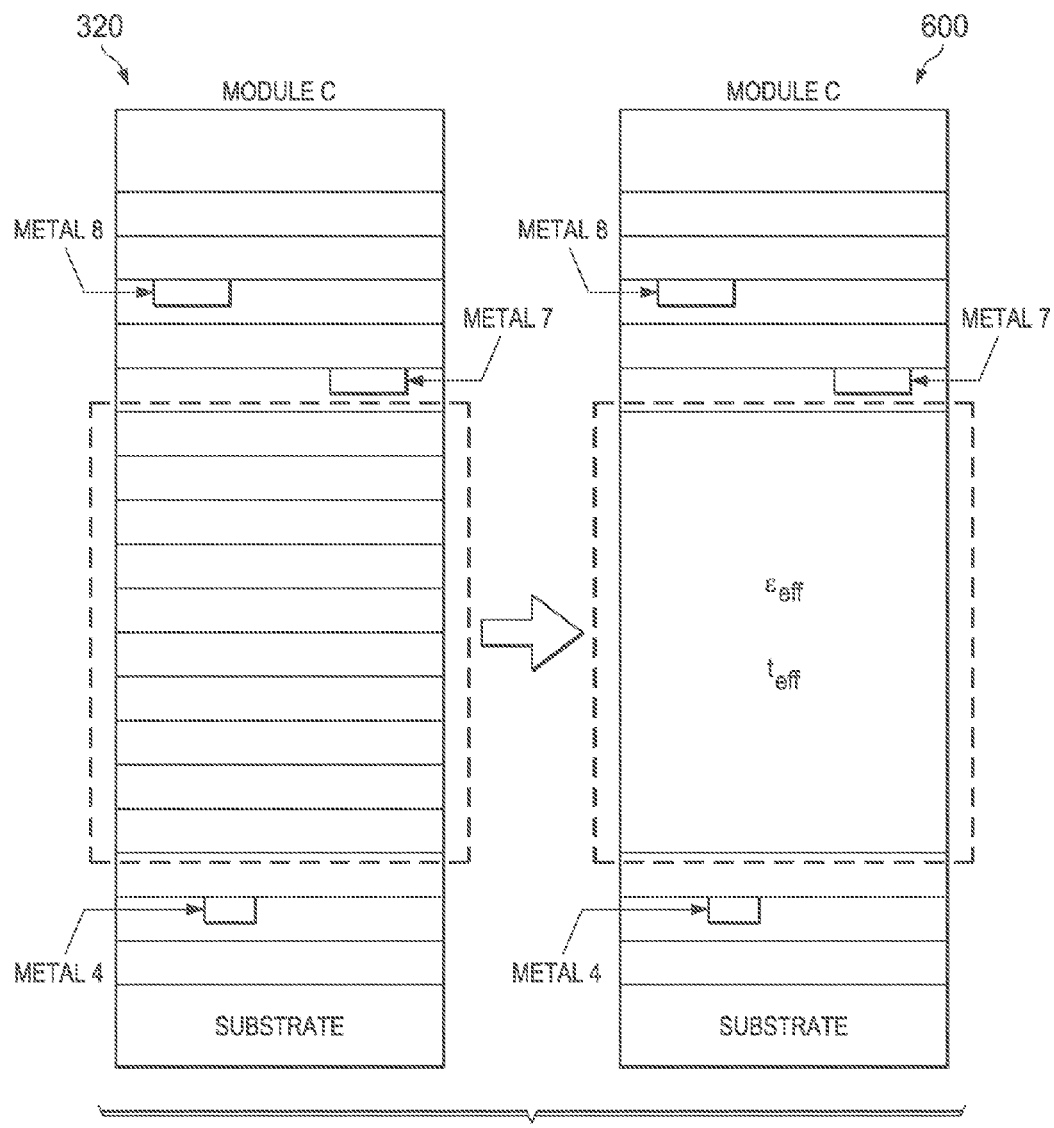
FIG. 6 illustrates a process of replacing various dielectric layers with an equivalent dielectric layer in a modular RC structure comprising both thick and thin interconnect conductors.

FIG. 6 illustrates a process of replacing various dielectric layers with an equivalent dielectric layer in a modular RC structure comprising both thick and thin interconnect conductors. As shown in FIG. 6, the interconnect conductors are located in the fourth interconnect layer, the seventh interconnect layer and the eighth interconnect layer. The dielectric layers between the fourth interconnect layer and the seventh interconnect layer do not comprise interconnect conductors. Therefore, the dielectric layers can be simplified into a single equivalent dielectric layer as shown in a modular RC structure 600. Similarly, the equations for the equivalent thickness and the equivalent dielectric constant are the same as those described above with respect to FIG. 4. It should be noted that while the upper layers in FIG. 6 comprise thick interconnect conductors, a person having ordinary skill in the art will recognize that upper layers comprising thin interconnect conductors are within the scope of the present invention.

Figure 7:
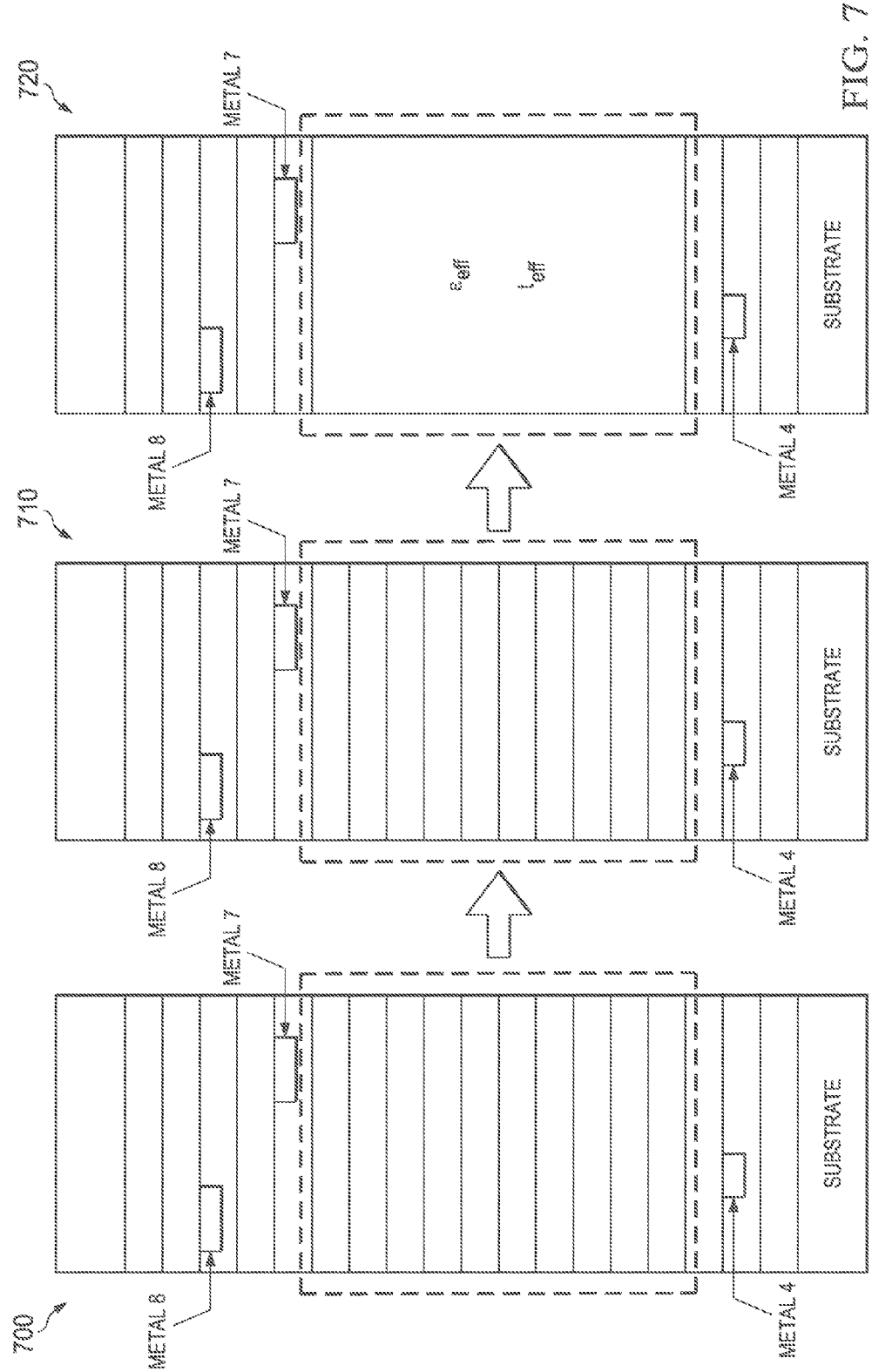
FIG. 7 illustrates a process of replacing various dielectric layers with an equivalent dielectric layer in a modular RC structure comprising dielectric thickness variations.

FIG. 7 illustrates a process of replacing various dielectric layers with an equivalent dielectric layer in a modular RC structure comprising dielectric thickness variations. A dielectric layer is made of silicon oxide, silicon nitride and the like. Due to the difficulties of producing a thin layer across the entire wafer during chip fabrication process, small dielectric layer thickness variations may exist in comparison of the thickness defined during a back-end-of-line (BEOL) stage. The dielectric layer thickness variations may cause parasitic capacitance variations, which may exceed the specification defined based on the BEOL thickness. As shown in FIG. 7, dielectric thickness variations can be fully considered through the process of replacing various dielectric layers with an equivalent dielectric layer. A modular RC structure 700 depicts the BEOL thickness of the dielectric layers between the fourth metal layer and the seventh metal layer. During chip fabrication process, the real thickness of each dielectric layer may differ from the nominal BEOL thickness. A modular RC structure 710 shows the variations. A wafer inspection system may detect the variation of each dielectric layer. The detected thickness of each dielectric layer is used to calculate the equivalent dielectric constant and equivalent thickness. A modular RC structure 720 illustrates an equivalent dielectric layer comprising each dielectric layer's thickness variation. As a result, the modular RC structure 720 reflects the real thickness of each dielectric layer rather than the projected thickness defined during the BEOL stage.

Figure 8:
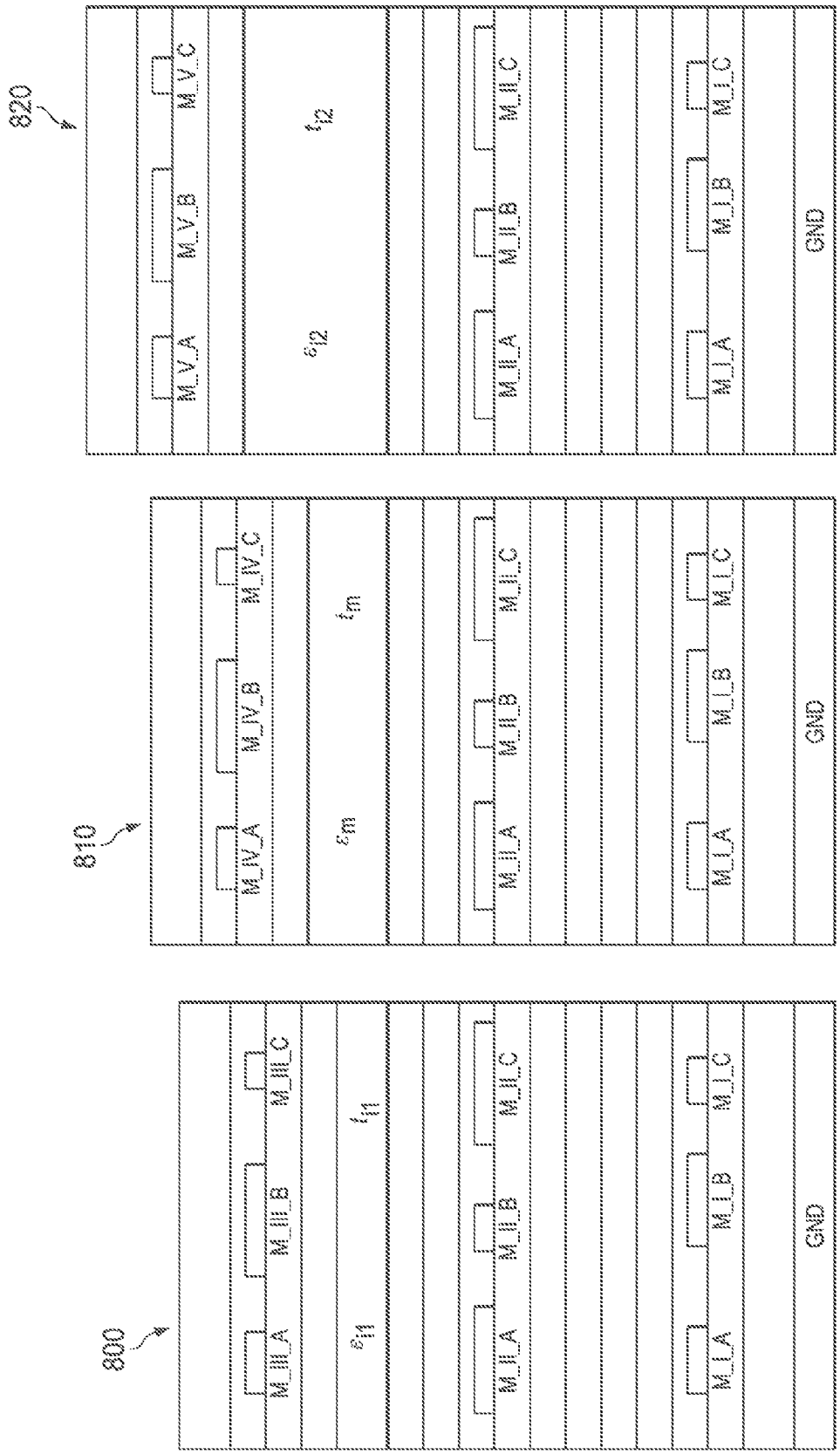
FIG. 8 illustrates an example of deriving a metal scheme's parasitic capacitance from two macro models.

FIG. 8 illustrates an example of deriving a metal scheme's parasitic capacitances from two macro models. FIG. 8 illustrates three metal schemes comprising both thick and thin interconnects. In accordance with an embodiment, a metal scheme 800 and a metal scheme 820 are selected as modular RC structures. A field solver receives the interconnect files of both the metal scheme 800 and the metal scheme 820 and calculates the parasitic capacitance values. The outcome of the field solver is the RC technology files for the metal scheme 800 and the metal scheme 820. The RC technology file of the modular RC structure 810 can be derived from the RC technology files of modular RC structures 800 and 820.

For a modular RC structure having n conductors and one ground, there are (n+1)n/2 coupling capacitances and n parasitic capacitances from n conductors to ground. As described above, the capacitances of the modular RC structures 800 and 820 have been calculated by a field solver through solving Maxwell's equations. The capacitances of the metal scheme 810 can be calculated by the following equations:

$$C_m = C_{i1} + S \times f$$

where $C_m$ is the capacitances in the metal scheme 810 (e.g., the capacitances between the conductor M_IV_A and M_II_A in modular RC structure 810), $C_{i1}$ is the corresponding capacitance in the modular RC structure 800 (e.g., the capacitances between the conductor M_III_A and M_II_A in modular RC structure 800). S and f are defined as follows:

$$S = \frac{C_{i2} - C_{i1}}{t_{i2} - t_{i1}}$$

$$f = \frac{(t_m - t_{i1}) \times \varepsilon_m}{\varepsilon_{i1} + (\varepsilon_{i2} - \varepsilon_{i1}) \times \left(\frac{t_m - t_{i1}}{t_{i2} - t_{i1}}\right)}$$

From the equations above, the capacitances of the metal scheme 810 can be calculated by the following equation:

$$C_m = C_{i1} + C_{i2} - C_{i1} \times \frac{(t_m - t_{i1})}{t_{i2} - t_{i1}} \times \frac{\varepsilon_m}{\varepsilon_{i1} + (\varepsilon_{i2} - \varepsilon_{i1}) \times \left(\frac{t_m - t_{i1}}{t_{i2} - t_{i1}}\right)}$$

One advantageous feature of calculating a metal scheme's capacitances based on two modular RC structures is that the calculation resources can be reduced because the equation above only comprises a simple mathematical equation rather complicated Maxwell's equations. It should be noted that in a semiconductor foundry, there are a variety of modular RC structures having a similar interconnect distribution pattern but different dielectric layers. By simplifying various dielectric layers into a single equivalent dielectric layer and further selecting two modular RC structures as macro RC models, the other metal schemes' capacitances can be calculated by a simple mathematical equation shown above.

FIG. 9 illustrates a simplified block diagram of a computer system 900 that can be used to implement the method of generating RC technology files in accordance with an embodiment. The computer system 900 includes an RC technology file generator 910, a memory 920, a processor 930, a storage unit 940, user interface input devices 950, user interface output devices 960 and a data bus 970. It should be noted that this diagram is merely an example of a general purpose computer, which should not unduly limit the scope of the claims. Many other configurations of a computer are within the scope of this disclosure. One of ordinary skill in the art would also recognize the aging simulation method may be performed by other computer systems including a portable computer, a workstation, a network computer, or the like.

The RC technology file generator 910 may be a physical device, a software program, or a combination of software and hardware such as Application Specific Integrated Circuits (ASIC). In accordance with an embodiment, when a user launches the RC technology generation method through the user interface input devices 950, the processor 930 loads the schematic variation profiles and other relevant information from the storage unit 940. According to an embodiment, the RC technology generation method is implemented as a software program, the process 930 loads the software program from the RC technology file generator 910 and operates it in the memory 920. After the processor 930 performs each step of FIG. 1, the processor 930 sends the RC technology files for each schematic variation profile to the user interface output devices 960. In accordance with the RC technology profile of each schematic variation profile, design corners such as timing, noise and reliability can be estimated.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
a storage unit storing a plurality of metal schemes;
a first processor configured to:
load the plurality of metal schemes from the storage unit;
generate a modular RC structure from the plurality of metal schemes;
calculate at least one capacitance value of the modular RC structure;
calculate a first equivalent dielectric constant and a first equivalent height of the modular RC structure based upon a plurality of dielectric layers;
calculate a second equivalent dielectric constant and a second equivalent height for each of the plurality of metal schemes;
determine differences between the first and second equivalent dielectric constants and the first and second equivalent heights; and
derive at least one capacitance value of each of the plurality of metal schemes from the at least one capacitance value of the modular RC structure and from the differences between the first and second equivalent dielectric constants and the first and second equivalent heights.

2. The system of claim 1 further comprising:
a user interface input device configured to:
receive a plurality of schematic variation profiles from an integrated circuit foundry; and
a second processor configured to:
divide the plurality of variation profiles into at least one group of metal schemes; and
store the at least one group of metal schemes in the storage unit.

3. The system of claim 2, wherein the first processor and the second processor are a same processor.

4. The system of claim 1 further comprising:
a third processor configured to:
generate an RC technology file based upon the capacitance values of the modular RC structure; and
generate a plurality of RC technology files based upon the at least one capacitance value of each of the plurality of metal schemes.

5. The system of claim 4, wherein the first processor and the third processor are a same processor.

6. The system of claim 4 further comprising a user interface output device configured to:
receive the RC technology file for the modular RC structure; and
receive the plurality of RC technology files for the plurality of metal schemes.

7. The system of claim 1, wherein the modular RC structure has an interconnect configuration similar to interconnect configurations of the plurality of metal schemes.

8. A system for generating a resistance-capacitance (RC) technology file, the system comprising:
a storage unit storing a plurality of metal schemes;
a first processor configured to:
load the plurality of metal schemes from the storage unit; and
identify a first modular RC structure from the plurality of metal schemes;
a second processor configured to:
load the plurality of metal schemes from the storage unit; and
identify a second modular RC structure from the plurality of metal schemes;
a third processor configured to:
calculate one or more capacitance values of the first modular RC structure; and
calculate one or more capacitance values of the second modular RC structure;
a fourth processor configured to calculate an equivalent dielectric constant and an equivalent height for each of the plurality of metal schemes; and
a fifth processor configured to derive capacitance values of each of the plurality of metal schemes from the capacitance values of the first and second modular RC structures and from the equivalent dielectric constant and the equivalent height of each of the plurality of metal schemes.

9. The system of claim 8, wherein the first processor, the second processor, the third processor, the fourth processor, and the fifth processor are a same processor.

10. The system of claim 8 further comprising:
a sixth processor configured to:
identify at least one more modular RC structure; and
derive capacitance values of the plurality of metal schemes form the capacitance values from the first, the second, and the one more modular RC structures.

11. The system of claim 8 further comprising:
a seventh processor configured to:
find a group of metal schemes having a plurality of interconnects located in upper thick metal layers of the group of metal schemes and a plurality of dielectric layers located in lower thin metal layers.

12. The system of claim 8 further comprising:
a seventh processor configured to:
find a group of metal schemes having a plurality of interconnects located in lower thin metal layers of the group of metal schemes and a plurality of dielectric layers located in upper thick metal layers.

13. The system of claim 8 further comprising:
a seventh processor configured to:
find a group of metal schemes having a plurality of interconnects located in both upper thick metal layers and lower thin metal layers of the group of metal schemes and a plurality of dielectric layers located between the upper thick metal layers having interconnects and the lower thin metal layers having interconnects.

14. The system of claim 8, wherein the fourth processor is further configured to:
detect dielectric layer thickness variations of a metal scheme, and
calculate an equivalent height and equivalent dielectric constant in consideration of the dielectric layer thickness variations; and wherein the fifth processor is further configured to:
derive capacitance values of the metal scheme from the capacitance values of the first and the second modular RC structures.

15. The system of claim 8, wherein the fifth processor is further configured to store the derived capacitance values in the storage unit.

16. The system of claim 8, wherein the fifth processor is further configured to:
find a macro RC model for the plurality of metal schemes; and
derive an RC technology file for each of the plurality of metal schemes from the macro RC model.

17. A system comprising:
a storage unit;
a user interface input device configured to receive a plurality of schematic variation profiles;
a first processor configured to:
divide the plurality of variation profiles into a plurality of metal schemes;
generate a plurality of modular RC structures from the plurality of metal schemes;
calculate capacitance values for each of the plurality of modular RC structures;
calculate equivalent dielectric constants and equivalent heights for each of the plurality of modular RC structures;
calculate equivalent dielectric constants and equivalent heights for each of the plurality of metal schemes;
determine differences between the equivalent dielectric constants and equivalent heights of the plurality of modular RC structures and the corresponding plurality of metal schemes; and
derive capacitance values of each of the plurality of metal schemes from the capacitance values of the plurality of modular RC structures and from the differences between the equivalent dielectric constants and the equivalent heights of the plurality of modular RC structures and the corresponding plurality of metal schemes.

18. The system of claim 17, wherein the processor is further configured to:
detect dielectric layer thickness variations of a metal scheme, and
calculate an equivalent height and equivalent dielectric constant in consideration of the dielectric layer thickness variations.

19. The system of claim 17, wherein the processor is further configured to:
generate a plurality RC technology files based upon the capacitance values of each of the plurality of modular RC structures; and
generate a plurality of RC technology files based upon the capacitance values of each of the plurality of metal schemes.

20. The system of claim 17, wherein the processor configured to calculate capacitance values for each of the plurality of modular structures uses a field solver to calculate the capacitance values.

* * * * *